United States Patent
Wang et al.

(10) Patent No.: US 10,145,873 B2
(45) Date of Patent: Dec. 4, 2018

(54) COIL ARCHITECTURE FOR INDUCTIVE SENSORS

(71) Applicant: Rockwell Automation Technologies, Inc., Mayfield Heights, OH (US)

(72) Inventors: Lin Wang, Merrimack, NH (US); Frederic Boutaud, Lexington, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 172 days.

(21) Appl. No.: 14/319,844

(22) Filed: Jun. 30, 2014

(65) Prior Publication Data
US 2015/0377940 A1    Dec. 31, 2015

(51) Int. Cl.
*G01R 27/26* (2006.01)
*H01F 27/32* (2006.01)
(Continued)

(52) U.S. Cl.
CPC .......... *G01R 27/2611* (2013.01); *G01V 3/107* (2013.01); *H01F 5/02* (2013.01); *H01F 21/02* (2013.01); *H01F 27/2823* (2013.01); *H01F 27/306* (2013.01); *H01F 27/325* (2013.01); *H01F 27/402* (2013.01); *H01F 41/06* (2013.01); *H01F 2005/022* (2013.01)

(58) Field of Classification Search
CPC .......... H01F 27/325; H01F 5/02; G01V 3/28; G01V 3/10; G01R 27/2611
USPC ..................................................... 324/207.12
See application file for complete search history.

(56) References Cited

U.S. PATENT DOCUMENTS 4,074,210 A * 2/1978 Otake ...................... H01P 9/02
                                                        333/140
4,862,316 A   8/1989 Smith et al.
(Continued)

FOREIGN PATENT DOCUMENTS

| CN | 101031823 | 9/2007 |
| CN | 101346643 | 1/2009 |

(Continued)

OTHER PUBLICATIONS

Extended European Search Report for Application No. EP15174543.7-1556, dated Dec. 12, 2015, 13 pages.
(Continued)

*Primary Examiner* — Reena Aurora
(74) *Attorney, Agent, or Firm* — Amin, Turocy & Watson, LLP (57) ABSTRACT

A bobbin and coil architecture is provided for use in an inductive sensor. The architecture eliminates the need for coil shielding and reduces the sensor's sensitivity to temperature and proximate mounting hardware. In one or more embodiments, all or portions of separate coils are located in a common slot on the bobbin, rather than being segregated into separate slots. In an example configuration, two receiver coils may be located in respective two slots on the bobbin, and a transmitter coil may divided into two substantially equal subsets of windings, with each subset wound together with one of the receiver coils in a common slot. This yields a symmetrical and balanced winding architecture that requires fewer slots relative to designs that segregate all coils into separate slots.

20 Claims, 8 Drawing Sheets

(51) Int. Cl.
*H01F 27/28* (2006.01)
*H01F 27/30* (2006.01)
*H01F 27/40* (2006.01)
*H01F 41/06* (2016.01)
*H01F 5/02* (2006.01)
*H01F 21/02* (2006.01)
*G01V 3/10* (2006.01)

(56) References Cited

U.S. PATENT DOCUMENTS

| | | | | |
|---|---|---|---|---|
| 4,945,332 | A * | 7/1990 | Sakamoto | H01F 17/041 |
| | | | | 333/176 |
| 6,075,431 | A * | 6/2000 | Honma | H01F 38/42 |
| | | | | 336/180 |
| 7,378,768 | B2 * | 5/2008 | Ohkawa | H02K 3/525 |
| | | | | 310/194 |
| 7,446,642 | B2 * | 11/2008 | Fang | H01F 17/04 |
| | | | | 336/198 |
| 2008/0278154 | A1 | 11/2008 | Krapf et al. | |
| 2008/0303517 | A1 | 12/2008 | Skultety-Betz et al. | |

FOREIGN PATENT DOCUMENTS

| | | |
|---|---|---|
| DE | 102012202825 A1 | 8/2013 |
| DE | 102012012680 A1 | 1/2014 |

OTHER PUBLICATIONS

European Search Report for Application No. EP15174543.7-1556/2966656, dated Jan. 18, 2016, 2 pages.

Chinese Office Action for Chinese Patent Application No. 201510397044.7 dated Feb. 17, 2017, 6 pages (English Translation).

* cited by examiner

COIL ARCHITECTURE FOR INDUCTIVE SENSORS

BACKGROUND

The subject matter disclosed herein relates generally to inductive sensors, and, more particularly, to an inductive sensor coil architecture that reduces sensitivity to environmental variables and reduces the size of sensor components.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, an assembly for supporting coils of an inductive sensor is provided, comprising a transmitter coil and at least one receiver coil, wherein at least a portion of the transmitter coil is co-located with at least a portion of a receiver coil of the at least one receiver coil.

A method for arranging inductive coils of an inductive sensor is also described, the method comprising locating at least a first portion of a transmitter coil of the inductive sensor on a section of a winding structure, and locating at least a second portion of a receiver coil of the inductive sensor on the section of the winding structure together with at least the first portion of the transmitter coil.

Also, an inductive sensor is provided, comprising a transmitter coil comprising a first number of turns, and a receiver coil comprising a second number of turns, wherein at least a subset of the first number of turns of the transmitter coil are wound together with at least a subset of the second number of turns of the receiver coil.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Many industrial applications utilize inductive sensors for detecting presence of metal objects near the sensors. For example, proximity switches are often mounted at key locations on a conveyor system to detect when a part is present at that location. In another example, proximity switches may be mounted at the extreme ends of travel of an actuating component (e.g., a pneumatic cylinders, a clamp, etc.) to confirm when the actuating component has moved to a desired position (e.g., fully retracted, fully extended, clamped, unclamped, etc.).

Figure 1:
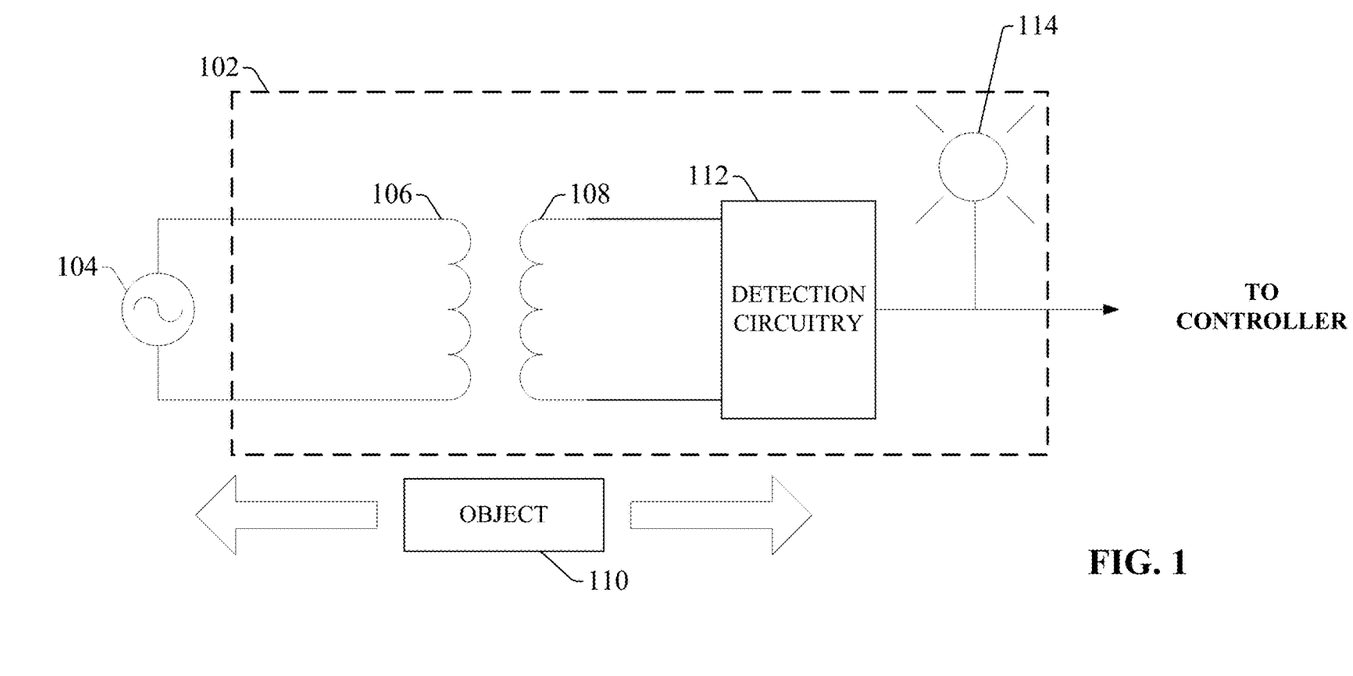
FIG. 1 is a generalized diagram of an example multi-coil inductive sensor.

FIG. 1 is a generalized diagram of an example multi-coil inductive sensor. Inductive sensor 102 comprises a transmitter coil 106 and receiver coil 108. Although example inductive sensor 102 depicts only a single transmitter coil and receiver coil, some inductive sensors may include multiple transmitter coils and/or receiver coils. An alternating current (AC) voltage or current source 104 (e.g., a sinusoidal or periodic voltage or current) is connected to transmitter coil 106, causing the transmitter coil 106 to generate an oscillating magnetic field that induces a current on receiver coil 108. Detection circuitry 112 monitors the induced current on receiver coil 108.

The transmitter coil 106 is generally located within the inductive sensor 102 such that the oscillating magnetic field is created in proximity of a sensing surface of the sensor, where the strength of the magnetic field is strongest in the axis of the sensor perpendicular to the sensing face. When an electrically conductive metal object 110 is located near the sensing surface in the axis of the sensor coils or the magnetic field, the presence of the object modifies the reparation of energy in the magnetic field, which in turn modifies the amplitude of the receive signal induced on receiver coil 108. Depending on the type of metal comprising object 110, presence of the object 110 may cause the current or voltage of the receive signal to either increase or decrease. Detection circuitry 112 is configured to generate an output in response to detecting that the induced current on receiver coil 108 has been modified in a manner indicative of the presence of object 110 (e.g., by determining that the induced current has fallen below or increased above a threshold indicative of the presence of a metal object in proximity to the sensing surface). For some types of sensors, such as proximity switches, the sensor may generate a discrete output indicating the presence of object 110. Other types of sensors may be configured to measure a distance of the object from the sensing surface. Such sensors may be configured to generate an analog value that is a function of the distance of the object 110 from the sensing surface. The output may be delivered to an industrial controller and used as an input for a control program. Some sensors may also include an LED 114 mounted on the sensor body that illuminates when the object 110 is detected.

In some sensor designs, the transmitter coils and receiver coils are wound around a multi-coil bobbin or other structure within the sensor. These bobbins are designed such that the transmitter and receiver coils are wound independently into separate slots of the bobbins. However, this coil configuration can be sensitive to environmental variables such as temperature and pressure. This configuration may also be sensitive to the presence of metal mounting components (e.g., brackets, nuts, or other mounting hardware). Additionally, this configuration requires a bobbin large enough to accommodate each coil within an individual slot To address these and other problems, one or more embodiments of this disclosure provide a winding architecture wherein multiple coils are wound together on a common portion of a winding structure (e.g., one coil on top of another coil or wound together with the other coil within a common slot of a bobbin or other winding structure). The receiver and transmitter coil can be wound on this bobbin according to a particular winding configuration. For example, for a sensor comprising two receiver coils and one transmitter coil, the two receiver coils may occupy respective two slots, and the transmitter coil may be divided into two halves, with each half wound together with one of the receiver coils. In another example winding, each transmitter coil may share a slot with a receiver coil. Other winding combinations are also considered.

Since multiple coils or coil portions are wound together, this winding architecture consumes less winding surface area. Thus, a smaller bobbin or other winding structure can be used, reducing the overall size of the sensor. Moreover, winding the coils in common slots can reduce sensitivity of the sensor to temperature and surrounding metals. Also, stacking the windings within common slots can cause the coils to behave as shielded coils without the need for a shield, thereby saving on manufacturing costs. In this regard, it is noted that conventional coil shields increase the temperature sensitivity of the overall sensing system due to the high temperature coefficient of the metal conductivity. Moreover, expansion and compression of the metal may cause stress on the shield and other components. The winding architecture described herein can mitigate these effects by eliminating the need for a shield.

Figure 2A:
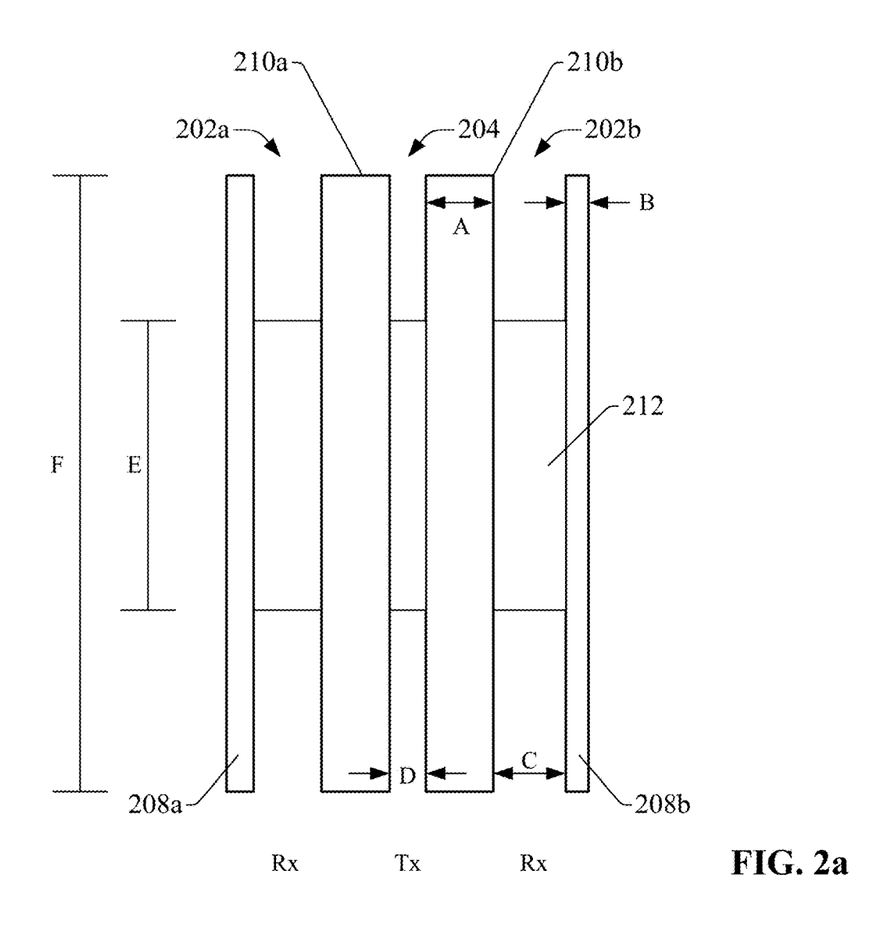
FIG. 2a is a side view of an example three-slot bobbin.
Figure 2B:
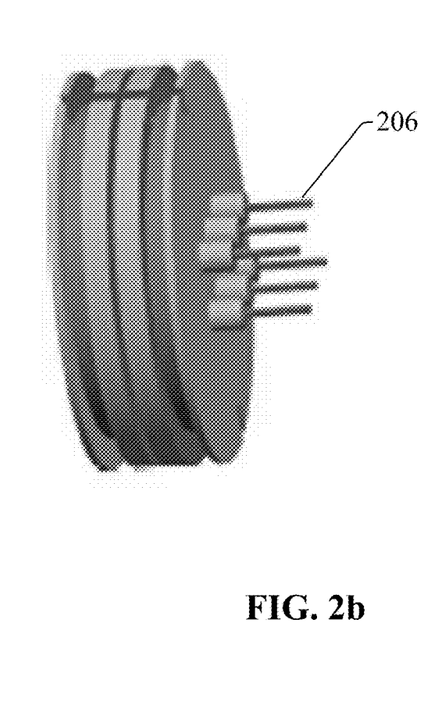
FIG. 2b a three-dimensional view of the example three-slot bobbin.

FIG. 2a is a side view of an example three-slot bobbin according to one or more embodiments of this disclosure. FIG. 2b is a three-dimensional view of the example bobbin. Although example winding configurations are described herein as being supported by a bobbin, it is to be appreciated that the winding architectures described herein are not dependent on the particular structure on which the windings reside, and can be implemented on any suitable winding structure. Additionally, in some embodiments, the winding architectures described herein may be implemented without the use of a winding structure.

The bobbin depicted in FIGS. 2a and 2b is designed for use in a sensor comprising one transmitter coil and two receiver coils. As shown in FIG. 2a, the two outer slots 202a and 202b may be dedicated to the two receiver (Rx) coils, respectively, and the middle slot 204 may be dedicated to the transmitter (Tx) coil. In an example, non-limiting configuration, the two receiver coils may comprise 120 turns each, wherein all 120 turns of the first receiver coil are located in slot 202a and all 120 turns of the second receiver coil are located in slot 202b. The transmitter coil may comprise 100 turns, all of which reside in slot 204.

If the two receiver coils comprise a greater number of turns then the transmitter coil, the middle slot 204 can be designed to be narrower than slots 202a and 202b. Alternatively, all three slots 202a, 202b, and 204 may be designed to have equal widths. In an example, non-limiting design, middle slot 204 may have a width D of approximately 0.8 mm, while slots 202a and 202b may have a width C of approximately 1.0 mm each. The dividing sections 210a and 210b between the transmitter coil slot 204 and receiver coil slots 202a and 202b may have widths A of approximately 1.0 mm, while the flanges 208a and 208b may have widths B of approximately 0.5 mm. The width E of spindle 212 relative to the width F of flanges 208a and 208b determines the depth of each slot. These measurements are only intended to be exemplary, and it is to be appreciated that any suitable dimensions may be used for the various elements. As shown in FIG. 2b, pins 206 protrude from one surface of the bobbin, and serve as electrical terminals for the coil ends. Other sensor components, such as AC voltage source 104, detection circuitry 112, or other components, can be electrically connected to the coil endpoints via pins 206.

Figure 3A:
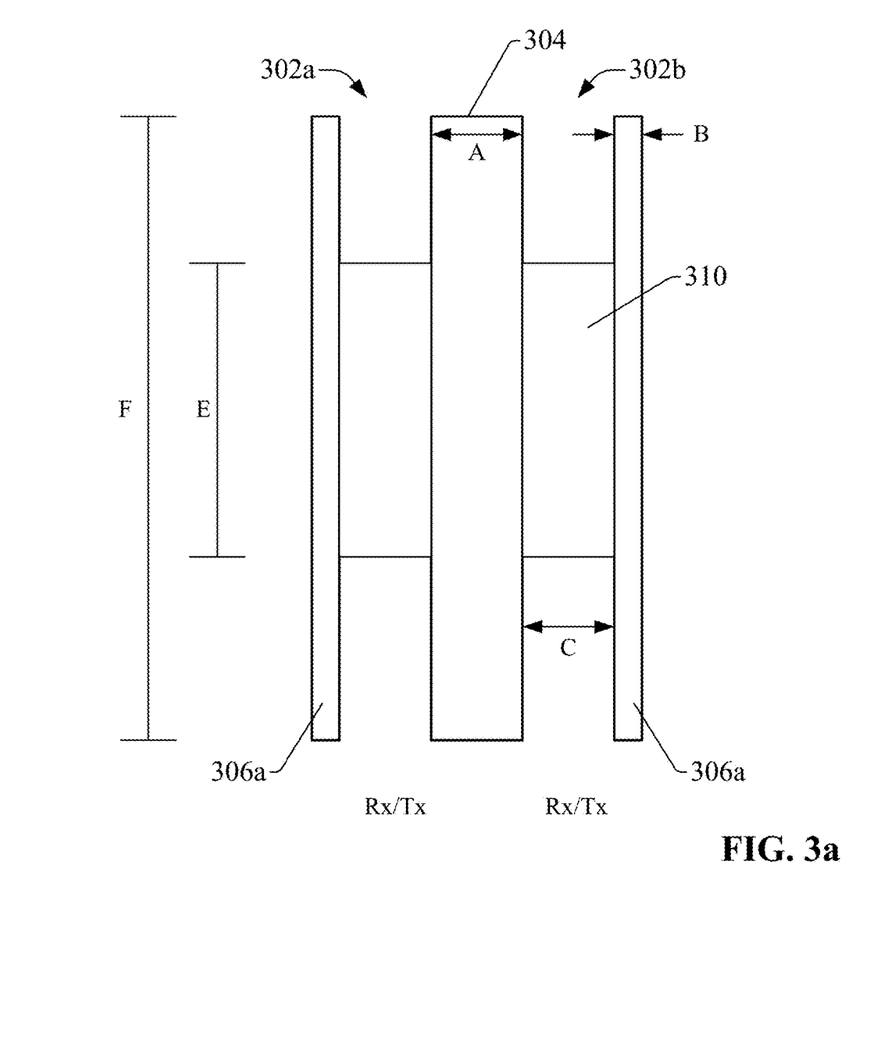
FIG. 3a is a side view of an example two-slot bobbin.
Figure 3B:
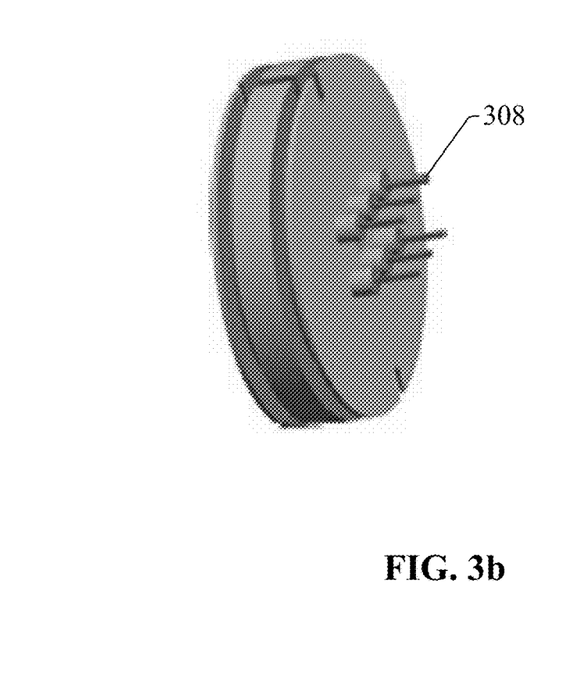
FIG. 3b is a three-dimensional view of the example two-slot bobbin
Figure 3C:
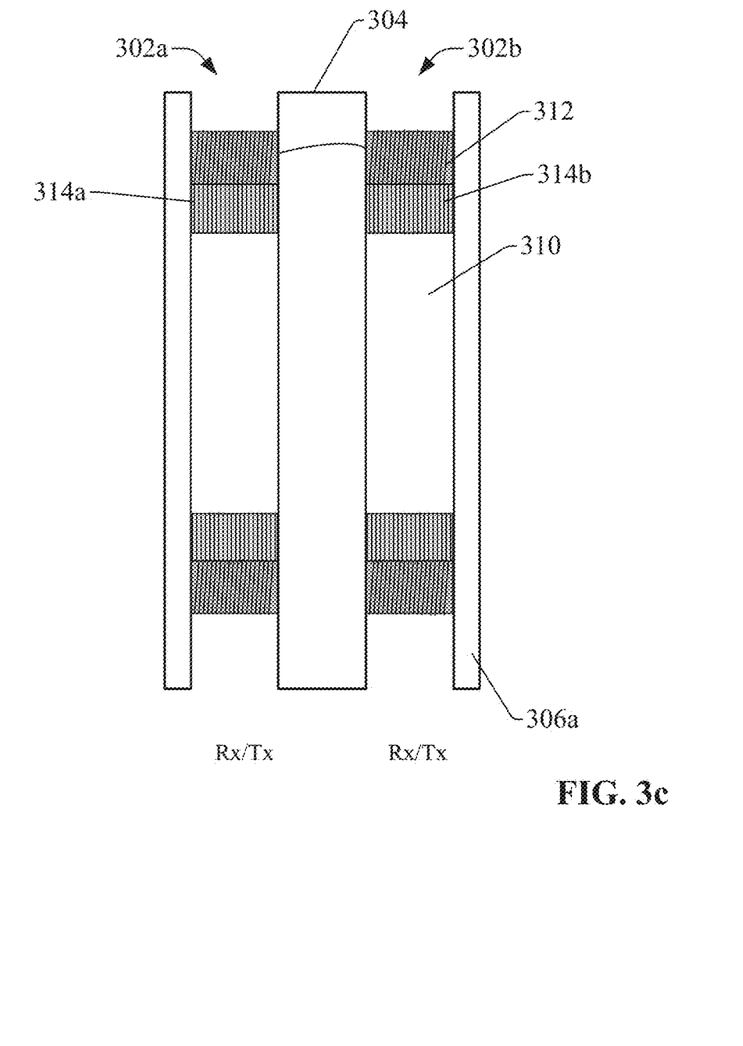
FIG. 3c is a cross-sectional side view of an example two-slot bobbin in which two receiver coils are located in the two slots, respectively, and a transmitter coil is divided into two portions that each reside within one of the two slots.

FIG. 3a is a side view of an example two-slot bobbin according to one or more embodiments, and FIG. 3b is a three-dimensional view of this example bobbin. This example bobbin comprises two slots 302a and 302b. In an example winding, each slot 302a and 302b can contain both receiver coil and transmitter coil windings. FIG. 3c is a cross-sectional side of the two-slot bobbin depicting an example winding for a sensor comprising two receiver coils 314a and 314b and one transmitter coil 312. In this illustrated example, each of the two slots 302a and 302b contains one of the two receiver coils 314a and 314b such that the two receiver coils 314a and 314b are separated by divider 304. The transmitter coil 312 can then be divided such that half of the transmitter coil windings reside in slot 302a (sharing the slot with the first receiver coil 314a) and the other half of the transmitter coil windings reside in slot 302b (sharing the slot with the second receiver coil 314b). By this winding configuration, each receiver coil shares a slot with half of the transmitter coil windings. For example, if the receiver coils 314a and 314b comprise 130 turns each and the transmitter coil 312 comprises 100 turns, slot 302a can contain all 130 turns of the first receiver coil 314a and 50 of the transmitter coil turns. Similarly, slot 302b can contain all 130 turns of the second receiver coil 314b and the remaining 50 turns of the transmitter coil 312. Accordingly, slots 302a and 302b are each sized to accommodate a total of 180 turns. Thus, although the bobbin of FIGS. 3a and 3c holds three coils (one transmitter coil and two receiver coils), this bobbin requires one less slot than the design depicted in FIGS. 2a and 2b, reducing the size of the bobbin.

In an example, non-limiting design, slots 302a and 302 may each have a width C of approximately 1.8 mm, divider 304 may have a width A of approximately 1.0 mm, and flanges 306a and 306b may have a width B of approximately 0.5 mm. These coil sizes and dimensions are only intended to be exemplary, and it is to be appreciated that any suitable dimensions can be used in the design of the example bobbin illustrated in FIGS. 3a and 3b, for accommodation of any number of transmitter and receiver coils of any number of windings. The width E of spindle 310 and the width F of flanges 306a and 306b can be sized as needed to accommodate the expected number of windings to be placed within each slot.

As in the example bobbin depicted in FIGS. 2a and 2b, the two-slot bobbin of FIGS. 3a and 3b can include pins 308 that protrude from one of the flanges, which serve as terminals for the coil ends.

Figure 2C:
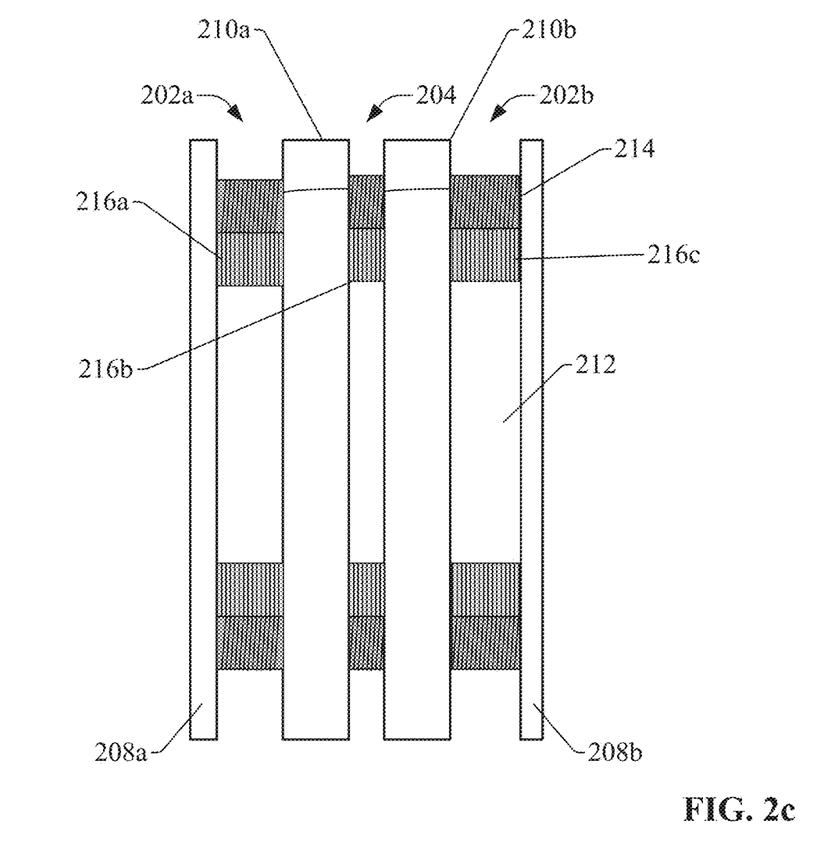
FIG. 2c is a cross-sectional side view of an example three-slot bobbin in which three receiver coils are located in the three slots, respectively, and a transmitter coil is divided into three portions that each reside within one of the three slots.

It is to be appreciated that the winding architecture described above—whereby different coils or portions of coils are wound in a same location or slot on a bobbin—is not limited to use with the two-slot bobbin illustrated in FIGS. 3a and 3b. In this regard, a bobbin having any number of slots, on which different coils or portions of coils are located in a common slot, is within the scope of one or more embodiments of this disclosure. For example, the above-described winding architecture may be adopted for the three-slot bobbin illustrated in FIGS. 2a and 2b. FIG. 2c is a cross-sectional side view of an example, non-limiting winding architecture for the three-slot bobbin, in which three receiver coils 216a, 216b, and 216c are located in the three slots 202a, 204, and 202b, respectively, and a transmitter coil 214 is divided into three portions that each reside within one of the three slots 202a, 204, and 202b.

Figure 4:
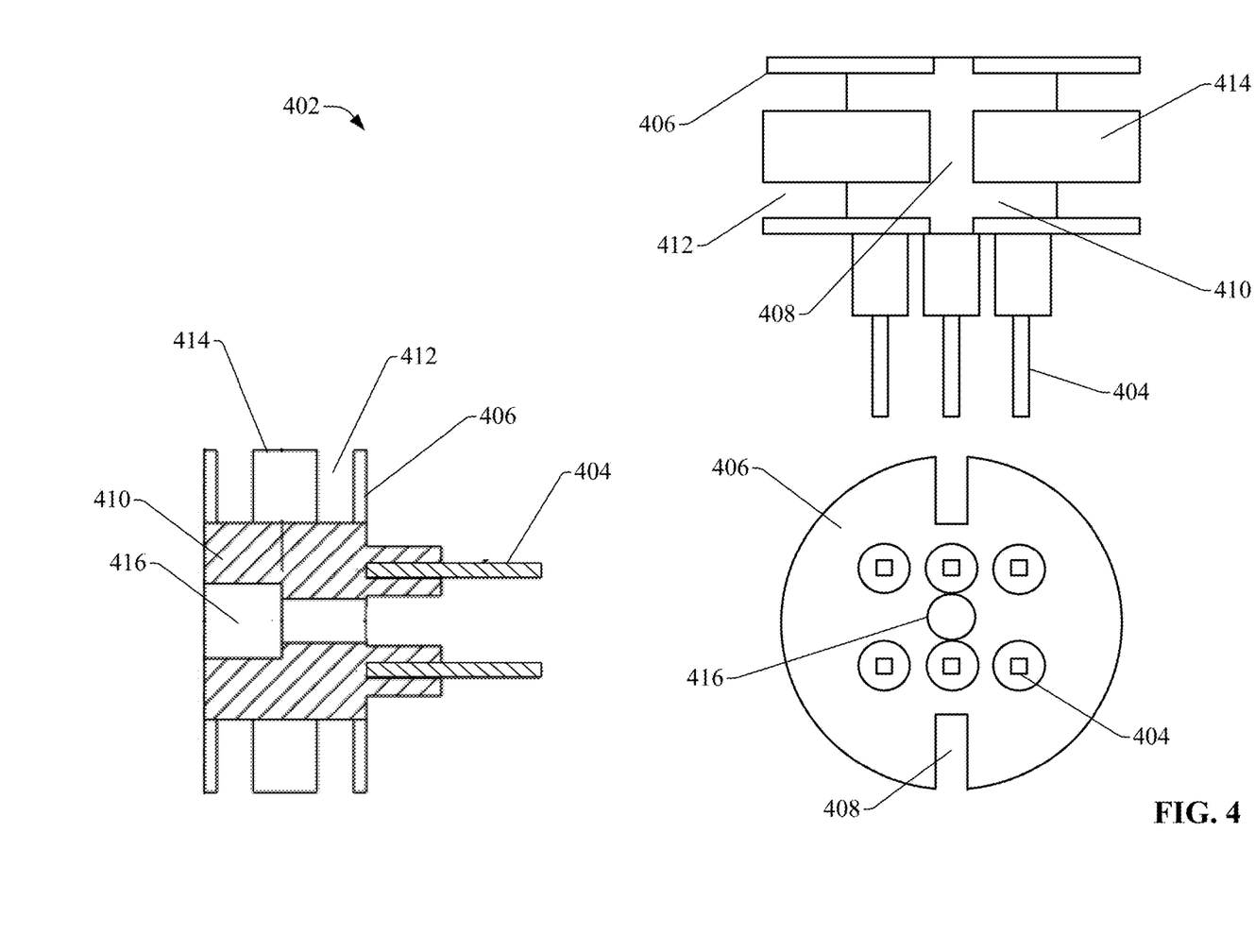
FIG. 4 is a multi-view drawing of an example two-slot bobbin.

FIG. 4 is a multi-view drawing of an example two-slot bobbin 402 according to one or more embodiments. As in previous examples, the bobbin 402 includes a spindle 410 and flanges 406 connected to each end of the spindle 410. Two slots 412 are defined by the spindle 410, flanges 406, and a dividing section 414. The slots 412 are configured to hold multiple windings of a transmitter coil and/or a receiver coil. In some example windings, each slot can contain both receiver coil windings and transmitter coil windings. For example, two receiver coils may be placed respectively in the two slots 412, and the windings of a transmitter coil may be divided into two halves, with each half placed in one of the two slots 412 with one of the receiver coils. This configuration is only intended to be exemplary, and it is to be appreciated that any winding configuration in which windings of separate coils share a common slot on a bobbin is within the scope of one or more embodiments of this disclosure. By allowing windings of separate coils to share slots on the bobbin 402, the size of bobbin 402 can be kept small relative to bobbin designs in which each coil must reside in a separate slot. Moreover, co-locating all or portions of separate coils within common slots can reduce the resulting sensor's sensitivity to temperature and surrounding metals.

Pins 404 protrude from one of the flanges 406, and server as terminals for the coil ends. Bobbin 402 includes six pins, providing terminals for three coils (e.g., one transmitter coil and two receiver coils). The pins 404 can be manufactured from any suitable conductive material. In some embodiments, pins 404 may be coated with a phosphorous bronze solder coating.

Bobbin 402 may also include notches 408 in the flanges 406 and dividing section 414, yielding open channels on opposite sides of the bobbin that run through both flanges and the dividing section. A hole 416 runs through the flanges 406 and spindle 410 to facilitate location and mounting of the bobbin 402 within the sensor.

Figure 5:
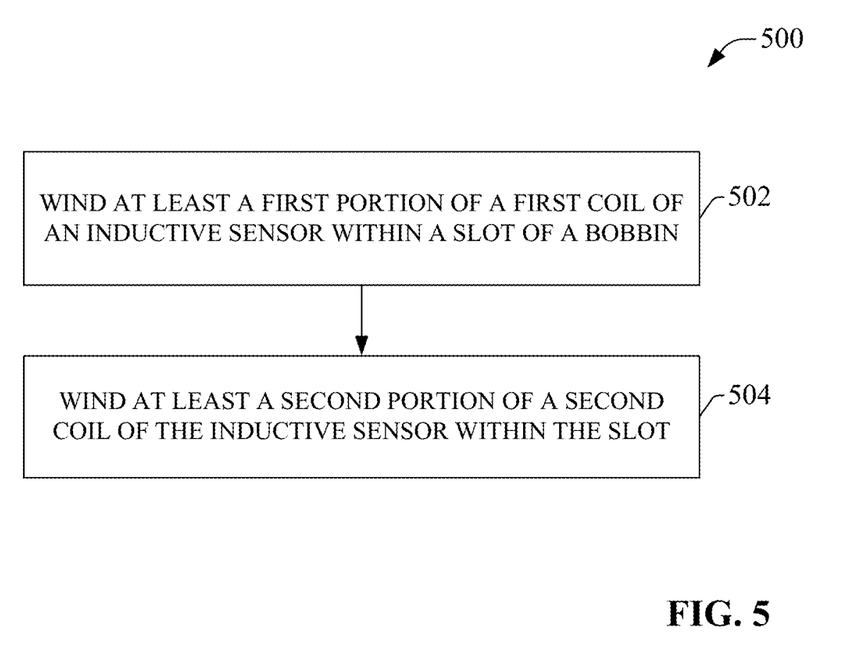
FIG. 5 is a flowchart of an example methodology for winding coils of an inductive sensor.
Figure 6:
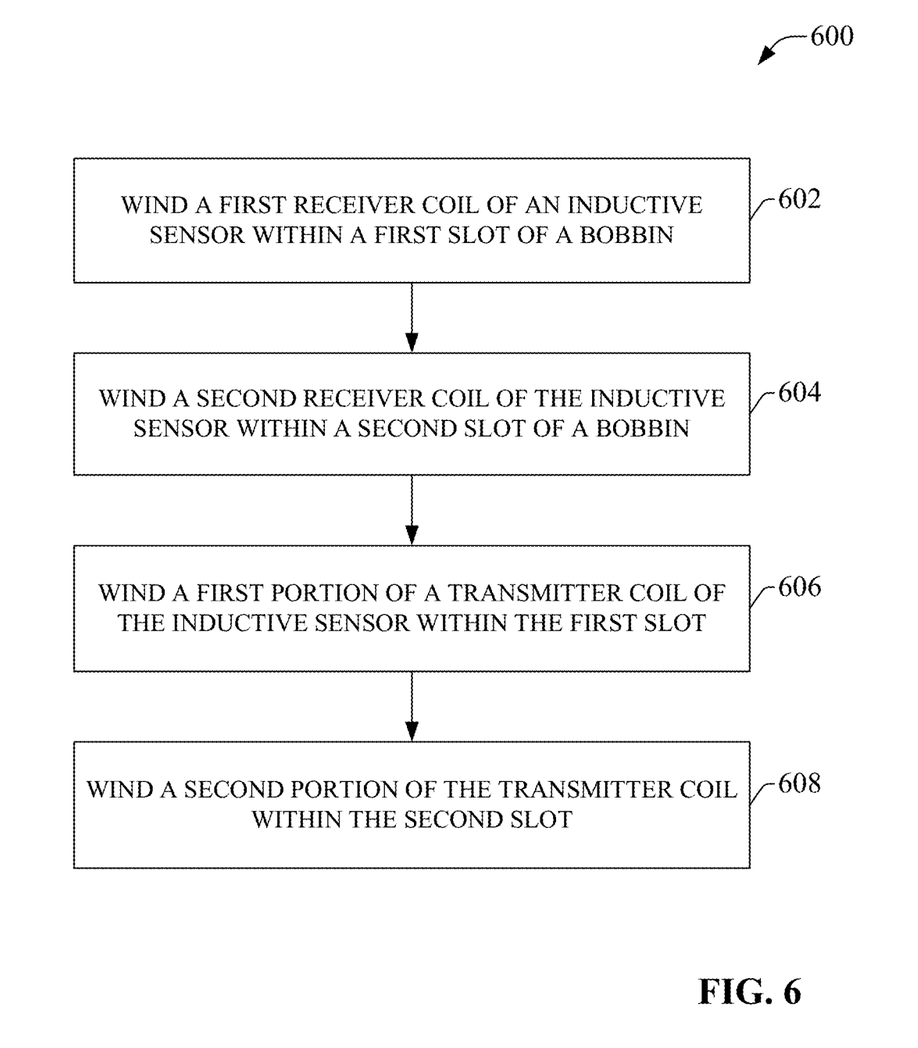
FIG. 6 is a flowchart of an example methodology for winding coils of an inductive sensor comprising two receiver coils and one transmitter coil.

FIGS. 5-6 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 5 illustrates an example methodology 500 for winding coils of an inductive sensor. Initially, at 502, at least a first portion of a first coil of an inductive sensor is wound within a slot of a bobbin. The first coil may be a receiver coil or a transmitter coil of the sensor. At 504, at least a second portion of a second coil of the inductive sensor is wound within the slot, thereby causing the two coils (or coil portions) to reside in the same slot.

FIG. 6 illustrates an example methodology 600 for winding coils of an inductive sensor comprising two receiver coils and one transmitter coil. Initially, at 602, a first receiver coil of an inductive sensor is wound within a first slot of a bobbin. At 604, a second receiver coil of the inductive sensor is wound within a second slot of the bobbin. At 606, a first portion of a transmitter coil of the inductive sensor is wound within the first slot. In some scenarios, the first portion may be half or approximately half of the total number of transmitter coil windings. However, the first portion may be some other subset of the total number of transmitter coil windings. As a result of winding the first portion of the transmitter coil within the first slot, both the first receiver coil and the first portion of the transmitter coils are located within the first slot of the bobbin. At 608, a second portion of the transmitter coil (e.g., the remaining windings of the transmitter coil after the first portion has been wound into the first slot) is wound into the second slot, thereby placing the second portion of the transmitter coil within the same slot as the second receiver coil.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. An assembly for an inductive sensor, comprising:
a winding structure comprising two slots;
a transmitter coil divided into a first portion and a second portion, wherein each of first portion and the second portion comprises a number of turns less than a total number of turns of the transmitter coil;
a first receiver coil; and
a second receiver coil,
wherein
the first portion of the transmitter coil and all turns of the first receiver coil are co-located in a first slot of the two slots, and
the second portion of the transmitter coil and all turns of the second receiver coil are co-located in a second slot of the two slots.

2. The assembly of claim 1, wherein the winding structure comprises a bobbin having at least two slots, including the first slot and the second slot.

3. The assembly of claim 2, wherein the bobbin comprises electrically conductive pins that protrude from a flange, and wherein the electrically conductive pins are configured to electrically connect to respective ends of the transmitter coil, the first receiver coil, and the second receiver coil.

4. The assembly of claim 1, further comprising a sensing component configured to detect a change in a current induced on at least one of the first receiver coil or the second receiver coil by the transmitter coil.

5. The assembly of claim 4, wherein the sensing component is configured to generate at least one of a discrete output or an analog output in response to detection of the change in the current.

6. The assembly of claim 1, wherein
the transmitter coil is further divided into a third portion comprising a number of turns less than a total number of turns of the transmitter coil,
the assembly further comprises a third receiver coil, and
the third portion of the transmitter coil and all turns of the third receiver coil are co-located in a third slot of the winding structure.

7. The assembly of claim 1, wherein the first receiver coil is stacked on top of the first portion of the transmitter coil in the first slot.

8. The assembly of claim 1, wherein the first portion of the transmitter coil is stacked on top of the first receiver coil in the first slot.

9. A method for arranging inductive coils of an inductive sensor, comprising:
locating a first portion of a transmitter coil of the inductive sensor in a first slot of two slots of a winding structure, wherein the first portion of the transmitter coil comprises a first number of turns less than a total number of turns of the transmitter coil;
locating a second portion of the transmitter coil in a second slot of the winding structure, wherein the second portion of the transmitter coil comprises a second number of turns less than the total number of turns of the transmitter coil;
locating all turns of a first receiver coil of the inductive sensor in the first slot of the winding structure together with the first portion of the transmitter coil; and
locating all turns of a second receiver coil of the inductive sensor in the second slot of the winding structure together with the second portion of the transmitter coil.

10. The method of claim 9, wherein the locating the first portion of the transmitter coil, the locating the second portion of the transmitter coil, the locating all turns of the first receiver coil, and the locating all turns of the second receiver coil comprise locating on a multi-coil bobbin, and wherein the multi-coil bobbin is the winding structure.

11. The method of claim 9, further comprising electrically connecting ends of the transmitter coil and at least one of the first receiver coil or the second receiver coil to electrically conductive pins that protrude from a flange of the winding structure.

12. The method of claim 9, further comprising
detecting a change in a current induced on at least one of the first receiver coil or the second receiver coil by the transmitter coil; and
generating at least one of a discrete output or an analog output in response to the detecting.

13. An inductive sensor, comprising:
a winding structure comprising two slots;
a transmitter coil comprising a number of turns;
a first receiver coil comprising a total number of turns that are wound in a first slot of the two slots; and
a second receiver coil comprising a total number of turns that are wound in a second slot of the two slots,
wherein
a first subset of the number of turns of the transmitter coil are wound in the first slot, and
a second subset of the number of turns of the transmitter coil are wound in the second slot.

14. The inductive sensor of claim 13, wherein the winding structure is a multi-coil bobbin comprising the first slot and the second slot, and wherein the first slot and the second slot are defined by flanges located at respective ends of a spindle of the multi-coil bobbin and a dividing section located on the spindle between the flanges.

15. The inductive sensor of claim 14, wherein the first receiver coil and the second receiver coil are physically separated by the dividing section.

16. The inductive sensor of claim 14, wherein the first subset of the number of turns and the second subset of the number of turns are separated by the dividing section.

17. The inductive sensor of claim 13, wherein the first subset of the number of turns and the second subset of the number of turns are equal in number or approximately equal in number.

18. The inductive sensor of claim 13, wherein ends of the transmitter coil and ends of at least one of the first receiver coil or the second receiver coil are connected to electrically conductive pins projecting from one of the flanges.

19. The inductive sensor of claim 13, further comprising a sensing component configured to detect changes in a current induced on at least one of the first receiver coil or the second receiver coil by the transmitter coil.

20. The inductive sensor of claim 19, wherein the sensing component is configured to generate at least one of a discrete output or an analog output in response to a detected change in the current induced on at least one of the first receiver coil or the second receiver coil by the transmitter coil.

* * * * *